(12) United States Patent
Schauer (10) Patent No.: US 8,064,070 B2
(45) Date of Patent: Nov. 22, 2011

(54) METHODS AND APPARATUS FOR AN INTEGRAL LOCAL SUBSTRATE CENTER FINDER FOR I/O AND CHAMBER SLIT VALVES

(75) Inventor: Ronald V. Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 373 days.

(21) Appl. No.: 12/359,314

(22) Filed: Jan. 24, 2009

(65) Prior Publication Data

US 2009/0192633 A1 Jul. 30, 2009

Related U.S. Application Data

(60) Provisional application No. 61/023,823, filed on Jan. 25, 2008.

(51) Int. Cl.
  *G01B 11/14* (2006.01)
(52) U.S. Cl. ...................................................... 356/614
(58) Field of Classification Search .................. None
  See application file for complete search history.

(56) References Cited

U.S. PATENT DOCUMENTS

| 6,082,950 A | 7/2000 | Altwood et al. |
| 6,198,976 B1 | 3/2001 | Sundar et al. |
| 2007/0129827 A1 | 6/2007 | Schauer |
| 2007/0189596 A1* | 8/2007 | Lee et al. ................. 382/151 |
| 2007/0285673 A1 | 12/2007 | Kiley et al. |
| 2008/0135788 A1 | 6/2008 | Fogel |
| 2008/0145194 A1 | 6/2008 | Kiley et al. |
| 2008/0147333 A1 | 6/2008 | Van der Meulen et al. |

FOREIGN PATENT DOCUMENTS

| JP | 04-026554 | 3/1992 |
| JP | 2004-282002 | 10/2004 |
| KR | 10-2006-0087697 | 8/2006 |
| KR | 10-2007-0018358 | 2/2007 |
| WO | WO 99/45579 | 9/1999 |
| WO | WO 2007/103896 A2 | 9/2007 |

OTHER PUBLICATIONS

International Preliminary Report on Patentability and Written Opinion of International Application No. PCT/US/2009/031933 (11224-PCT) mailed Aug. 5, 2010.
International Search Report and Written Opinion of PCT Application No. PCT/US/2009/031933 mailed Aug. 20, 2009.

* cited by examiner

*Primary Examiner* — Tu Nguyen
(74) *Attorney, Agent, or Firm* — Dugan & Dugan, PC (57) ABSTRACT

Systems and apparatus are provided for locating the center of a substrate. The invention includes a frame, mounted between a slit valve assembly and a transfer chamber wall in substrate processing equipment; at least one emitter, housed in the frame, and adapted to emit a signal; at least one sensor, housed in the frame, and adapted to receive the emitted signal; and a controller adapted to determine a center of a substrate based on the signal received by the sensor. Numerous other aspects are provided.

23 Claims, 6 Drawing Sheets

FIG. 6

METHODS AND APPARATUS FOR AN INTEGRAL LOCAL SUBSTRATE CENTER FINDER FOR I/O AND CHAMBER SLIT VALVES

The present application claims priority from the following U.S. Provisional Patent Application, which is hereby incorporated by reference herein in its entirety:

U.S. Provisional Patent Application Ser. No. 61/023,823, filed Jan. 25, 2008, and entitled "METHODS AND APPARATUS FOR AN INTEGRAL LOCAL SUBSTRATE CENTER FINDER FOR I/O AND CHAMBER SLIT VALVES".

CROSS-REFERENCE TO RELATED APPLICATIONS

The present application is related to U.S. patent application Ser. No. 11/561,118, filed Nov. 17, 2006, entitled "HIGH TEMPERATURE OPTICAL SENSOR DEVICE FOR SUBSTRATE FABRICATION EQUIPMENT," which claims priority to U.S. Provisional Patent Application Ser. No. 60/738,077, filed Nov. 17, 2005, entitled "HIGH TEMPERATURE OPTICAL SENSOR DEVICE FOR WAFER FABRICATION EQUIPMENT" both of which are hereby incorporated herein by reference in their entirety for all purposes.

FIELD OF THE INVENTION

The present invention relates generally to electronic device and/or substrate processing systems, and is more particularly concerned with locating ideal pick up and drop off positions of a substrate wafer in a processing chamber.

BACKGROUND OF THE INVENTION

Processing of substrates (e.g., semiconductor, glass, etc.) for use in electronic devices is typically done in one or more processing chambers of a processing tool. The substrates may be moved between the processing chambers via a central transfer chamber. A slit valve connects the central transfer chamber to a processing chamber. Robot arms rotate and extend to load and unload the substrate wafers from the processing chambers. The substrates must be precisely positioned on the robot arms (or blades) in ideal pickup and drop positions. Deviations from these ideal positions may create negative consequences later in the processing of the substrates. For example, if the substrates are not properly positioned and seated on the robot arms at the time of pickup, the substrates may slide off the arms during withdrawal from the processing chambers. This may result in the substrate being partially left on the processing chuck and partially in the slit valve, thereby requiring venting and opening of the transfer chamber to manually remove the substrate. Additionally, the substrate may be contaminated, damaged or even broken, by contact with the chamber parts or motions of the slit valve, particularly if the valve is closed prematurely. These negative consequences may result in longer and more expensive processing times, which is undesirable.

Conventional systems for precisely positioning the substrates include using specialized setup tools and measurement wafers (such as "camera on wafer") to program the rotation and extension of the robot arms when loading or unloading the substrates from the processing chambers. However, some of the problems with these systems are that either the chambers must be opened to use the tools, or the tools themselves are extremely expensive and therefore may be quite limited in usage.

Additionally, the robots experience normal wear, particularly at the bearings, as well as changes in temperature, which will therefore cause the robot components to expand and contract. Thus, the "ideal" pickup and drop positions for the substrate in the chamber change over time. However, if the extension and rotation of the robot arms are set to a particular measurement, as described by conventional systems, these set measurements do not account for these changes in the tools.

Moreover, as the substrates are in transit, the substrates themselves may shift on the arms, or move in the chambers as they are lowered onto or lifted from processing chucks and other apparatus. Robots having particularly calibrated extension and rotation movements are unable to adjust for these misplacements of the substrate on the robot arm. Accordingly a need exists for a system that allows for improved substrate centerfinding.

SUMMARY OF THE INVENTION

In certain aspects of the invention, an apparatus is employed for locating the true center of a substrate. The apparatus comprises: a frame, mounted between a slit valve assembly and a transfer chamber wall in substrate processing equipment; at least one emitter, housed in the frame, and adapted to emit a signal; at least one sensor, housed in the frame, and adapted to receive the emitted signal; and a controller adapted to determine a center of a substrate based on the signal received by the sensor.

In another aspect of the invention, an apparatus for locating the true center of a substrate is provided. The apparatus comprises: an I/O slit valve assembly, including a slit valve door adapted to selectively open and close the I/O slit valve, wherein the I/O slit valve assembly is positioned within a valve seat frame of a semiconductor processing equipment; at least one emitter, mounted integrally to the slit valve door, and adapted to emit a signal; at least one sensor, mounted integrally to the slit valve frame, and adapted to receive the emitted signal, wherein the at least one emitter and the at least one sensor are opposing optical devices; and a controller adapted to determine a center of a substrate based on the signal received by the sensor.

Another aspect of the invention provides a system comprising: a transfer chamber including a slit valve; a frame, mounted between the slit valve assembly and a transfer chamber wall in substrate processing equipment; at least one emitter, housed in the frame, and adapted to emit a signal; at least one sensor, housed in the frame, and adapted to receive the emitted signal; and a controller adapted to determine a center of a substrate based on the signal received by the sensor.

Other features and aspects of the present invention will become more fully apparent from the following detailed description, the appended claims and the accompanying drawings.

DETAILED DESCRIPTION

The present invention is directed to methods and apparatus for improved substrate center-finding (e.g., locating the center of a substrate) in substrate transfer chambers with high temperature conditions. In particular, the present invention may allow the substrate to be measured and the substrate center determined at the entrance to each processing chamber or cluster tool.

The present invention provides systems, methods, and apparatus for optically locating the true center of the substrate as the substrate passes through the slit valves. The true center may be located during both the extension of the robot arm inserting the substrate into the chamber and the retraction of the robot arm retracting the substrate from the chamber. In other words, the true center of the substrate may be determined each and every time a substrate is transferred into or out of the process chamber. This method may compensate for thermal effects and wear of robot components. The true substrate center may be used to more accurately and reliably position the substrate on the processing chamber receptacle or chuck.

Additionally, the present invention may minimize or eliminate the need for the setup tools described by the conventional systems. Once the ideal pickup/drop location is established within the substrate processing chamber, the calculated true center of the substrate may be used to automatically adjust the robot motions so as to place the substrate at the ideal location, or pick the substrate up from the ideal location.

The substrate's true center may also be used to more accurately position a withdrawn substrate into a storage elevator or other holding device, which may help reduce substrate transfer errors when the storage device is later unloaded.

Additionally, the substrate's true center may be used to accurately position the substrate onto the rotating chuck when loading the substrate into an orientation chamber, to help speed operation of the chamber.

To further optimize the operational speed of the chamber, the speed of the robot may be increased, and may even be automatic. The robot speed may be increased by the slit valve center-finder, which may be used to confirm the presence and proper positioning of the substrate on the robot blade at the entry or exit of the chamber. The center-finder may also be used to determine slit valve blockage and to prevent valve closure if the slit valve is in fact blocked. While conventional equipment may also provide this function in limited fashion, it is not always physically possible for the conventional equipment to be installed, as conventional equipment installation may often require severe modifications to the equipment to provide optical access to the substrate in transit. The present invention, on the other hand, requires few or no such physical modifications. Additionally, due to the physical positioning of the present invention, the operations of the present invention may be performed equally well whether the substrate is being inserted or withdrawn from a chamber.

Additionally, by utilizing existing algorithms and interface hardware, the center-finder operation may be made transparent to robot motions ("on the fly" operation). In other words, the robot controller may know the precise position of the robot arm and substrate chuck at all times. Therefore, the position information of the robot arms and chucks may be recorded during motions at optical transitions points for sensor pairs. Modern robot controllers may be capable of performing the necessary algorithmic calculations to determine the center of the substrate while simultaneously controlling the motions of the robot arms and chucks at full operating speed. Because the motions of the robot arms and chucks may not be affected during the algorithmic calculations, the center determination may be referred to as an "on the fly" operation.

In some embodiments, the apparatus may include a support frame, which may position, align, optically shield, and/or thermally shield componentry (e.g., optical emitters, optical sensors, wiring, etc.) housed within the frame. The shielded componentry, such as optical emitters and optical sensors, may be used for substrate positioning operations such as center and/or edge finding. The support frame may allow the shielded componentry to be aligned precisely and improve positional accuracy and substrate center determinations. Control circuitry (e.g., electronic logic boards, single-chip microcontrollers, microprocessors, etc.) for optical signal comparison, size selection routines, calibration functions, componentry control and/or other appropriate functions may be adjacent, attached to, or disposed remotely from the support frame. In some embodiments, the control circuitry may be positioned at an end of the support frame so as to prevent the control circuitry from being in proximity to hot substrates which radiate heat that may damage the control circuitry. In some embodiments, the support frame may be secured to a substrate transfer chamber using thermally conductive brackets, which may effectively help pass heat energy from a sensor frame to the surrounding structure so as to help dissipate heat to maintain relatively low temperatures within the body of the support frame and the sensor circuitry.

Figure 1:
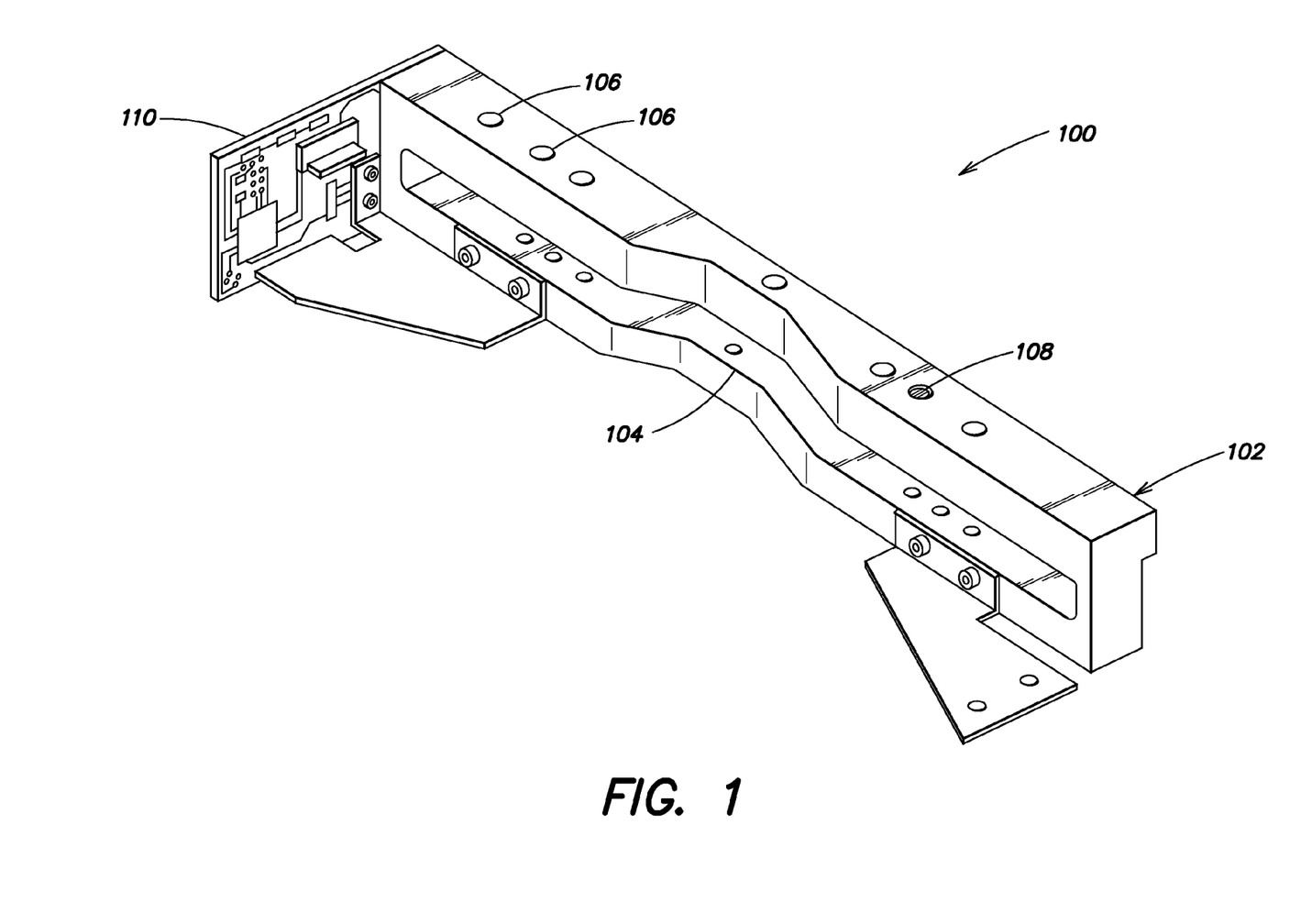
FIG. 1 is a front perspective view of an example embodiment of the apparatus of the present invention.

FIG. 1 illustrates a front perspective view of an embodiment of the apparatus of the present invention which is designated generally by the reference numeral 100. As shown in FIG. 1, the apparatus 100, in an exemplary embodiment, may include a support frame 102 which may have a cut away region 104 such that a substrate (not shown) may be passed therethrough. As further illustrated in FIG. 1, the support frame 102 may have one or more apertures 106 for housing and/or exposing optical componentry 108, such as optical sensors and/or optical emitters. The apparatus may further include a controller 110, which may be secured adjacent an end of the support frame 102. The controller 110 may be positioned in any other suitable location.

The support frame 102 may be constructed of any appropriate material, such as aluminum, stainless steel, titanium, and/or ceramic. Other suitable materials may be used. The support frame 102 may also be plated and/or coated to improve at least the heat reflectivity of the support frame 102. Exemplary platings and/or coatings may include metal plating such as 24K gold plating, ceramic coating, reflective plating, anodizing, and/or painting. Other suitable platings/coatings may be used. In some embodiments, the support frame 102 may have a shape that substantially conforms to the profile of an inner transfer chamber wall. In some embodiments, the frame 102 may be approximately 9" long by 1¾" high with a cut away region 104 approximately 8¾" long by ½" high. Such dimensions may be suitable for 200 millimeter substrates. Other suitable dimensions may be used. In particular, for example, dimensions practicable for a 300 millimeter substrate may be used (e.g., a frame 102 with a cut away region 104 approximately 12¾" by ½" high).

In operation, the substrate may be passed through the apparatus 100 (e.g., through the cut away region 104 in the support frame 102) when the substrate is passed into or out of a transfer chamber or other chamber. When the support frame 102 is positioned within a transfer chamber, the cut away region 104 may be coincident or aligned with the transfer chamber's slit valve. Accordingly, the support frame 102 may be of appropriate size and shape so as to fit adjacent the inner chamber wall of a transfer chamber without extending into the space reserved for a substrate elevator and/or robot, and/or substrate holding/moving areas, for example, or space reserved for any other suitable reason.

In some embodiments, a number of apertures (e.g., seven) disposed in a line or other spaced pattern may be available on an upper portion of the support frame 102 and additional corresponding apertures 106 may be available on a lower portion of the support frame 102. Although seven apertures 106 are depicted on the apparatus 100 in FIG. 1, any practicable number of apertures may be provided (e.g., 1, 2, 3, etc.). In some embodiments, one aperture pair (one aperture on the upper portion and the corresponding aperture on the lower portion) may provide substrate presence sensing only, while two aperture pairs may provide substrate presence sensing and center-finding functionality. In some embodiments, three pairs may be included to account for edge flats and notches in the substrate. The apertures 106 may be used for housing optical componentry 108 responsible for finding the leading and/or trailing tangent point of a substrate as the substrate passes through the cut away region 104. In some embodiments, the outside pairs of apertures 106 may be used for housing optical componentry 108 responsible for locating the outer edge of the substrate. For example, the innermost aperture pairs (e.g., the upper and lower apertures on both sides of the center apertures that are closest to the center apertures) may be used to find the edges of a five inch substrate. In some embodiments, the outermost aperture pairs may be used to find the edges of an eight inch substrate. In some embodiments, the aperture pairs between the innermost aperture pairs and outermost aperture pairs may be used to find the edges a six inch substrate. Any other appropriate spacing (e.g., location of aperture pairs) to determine the edge of any size or type of substrate may be used. The invention may be used with any type of substrate (e.g., semiconductor wafers, glass plate for flat panel displays, etc.) by utilizing appropriate optical componentry 108 devices and wavelengths.

The optical componentry 108 may include optical emitters and optical sensors used in tandem to determine the presence or absence of a transmitted optical signal, which may indicate the presence of a substrate (e.g., via transmission or reflection). Additionally or alternatively, high temperature fiber optics (e.g., plastic, glass, or fiber bundles) and/or image pipes may be used. Any other appropriate optical or other componentry may be used to detect the presence and/or absence of a substrate as the substrate passes through the support frame 102. Optical componentry 108 may be precisely aligned and/or positioned by placement in apertures 106 within the support frame 102. Additionally or alternatively, the support frame 102 may be molded around optical componentry 108 and/or optical componentry 108 may be integral in the construction of the support frame 102.

As mentioned above, in some embodiments, the controller 110 may be secured adjacent an end of the support frame 102. Additionally or alternatively, the controller 110 may be located at another location within the substrate transfer chamber, positioned at another location adjacent the support frame 102, and/or located outside the substrate transfer chamber. In an exemplary embodiment, the controller 110 may be spaced apart from an area that may contain substrates by about one inch or more. The controller 110 may be an electronic logic board, microcontroller such as a single-chip microcontroller, microprocessor, or the like. The controller 110 may be adapted to provide automatic calibration and/or size selection for the inventive apparatus 100 and/or facilitate the detection and calculation of the center location of a substrate.

Figure 2:
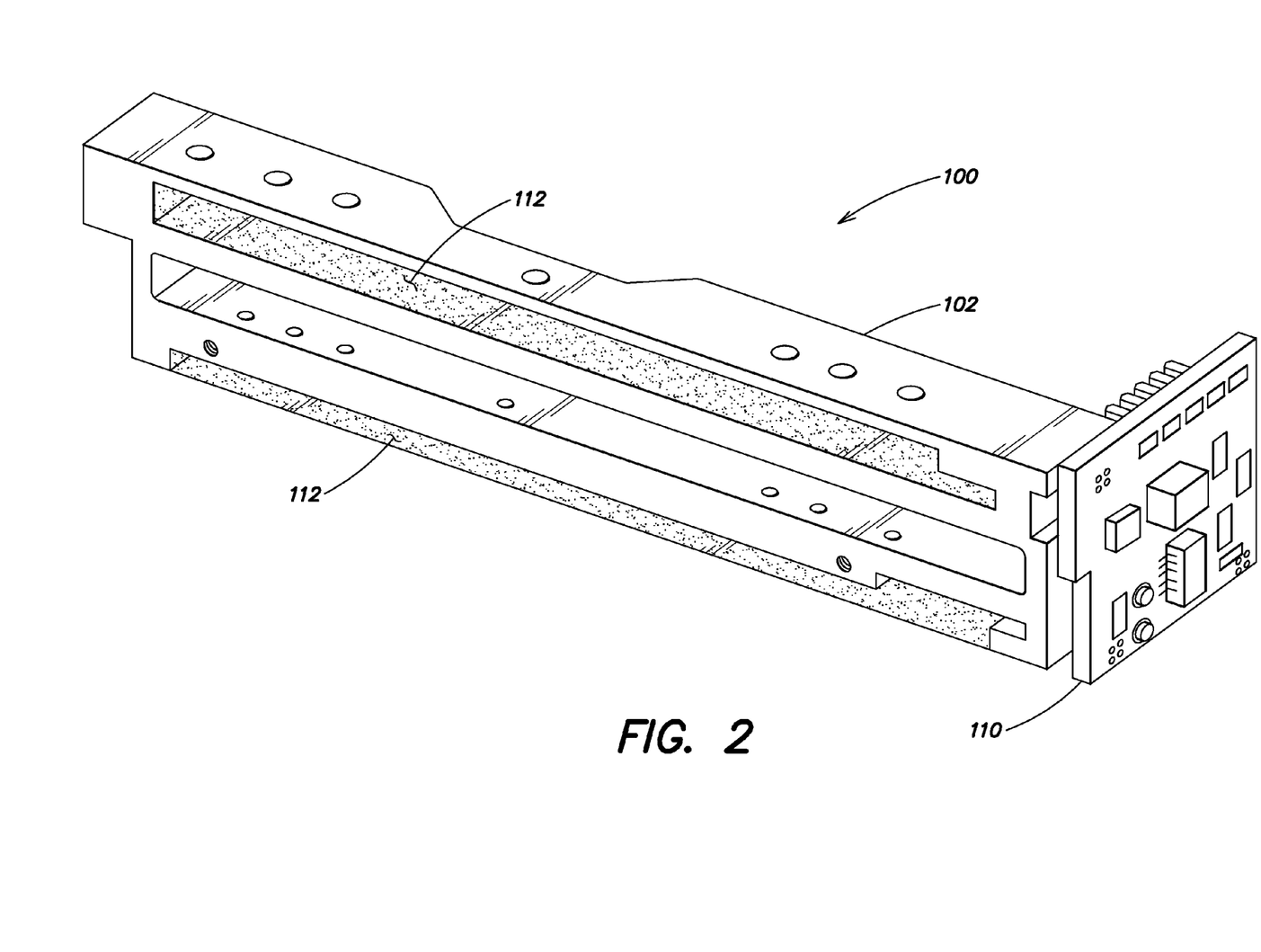
FIG. 2 is a rear perspective view of an example embodiment of the apparatus of the present invention.

Turning to FIG. 2, a rear perspective view of an embodiment of the apparatus 100 of the present invention is illustrated. The optical componentry 108 (FIG. 1) may be electrically coupled to the controller 110 through wiring channels 112, which may be, for example, potted with an opaque encapsulation material and/or other heat and/or light shielding material. The optical and/or electrical componentry 108 housed within the apertures 106 may be connected to the controller 110 via wiring housed within the support frame 102. The wiring channels 112 may be disposed within the support frame 102 and may be accessible from the rear of the support frame 102, as shown in FIG. 2. For example, wiring, electrical componentry, and/or optical componentry may be potted in the support frame 102 with an encapsulation material (or otherwise secured within the support frame 102). The particular encapsulation material used may preferably be capable of withstanding high radiant heat temperatures and be capable of shielding componentry contained within the encapsulation material from the damaging effects of heat. Exemplary encapsulation materials may include commercially available products, such as Torr-Seal, manufactured by Varian, Inc. of Palo Alto, Calif., Marine Grade Epoxy, manufactured by Tap Plastics of Dublin, Calif., HT Epoxy, manufactured by Master Bond, Inc. of Hackensack, N.J., etc, for example. Other suitable encapsulation materials may be used.

Figure 3:
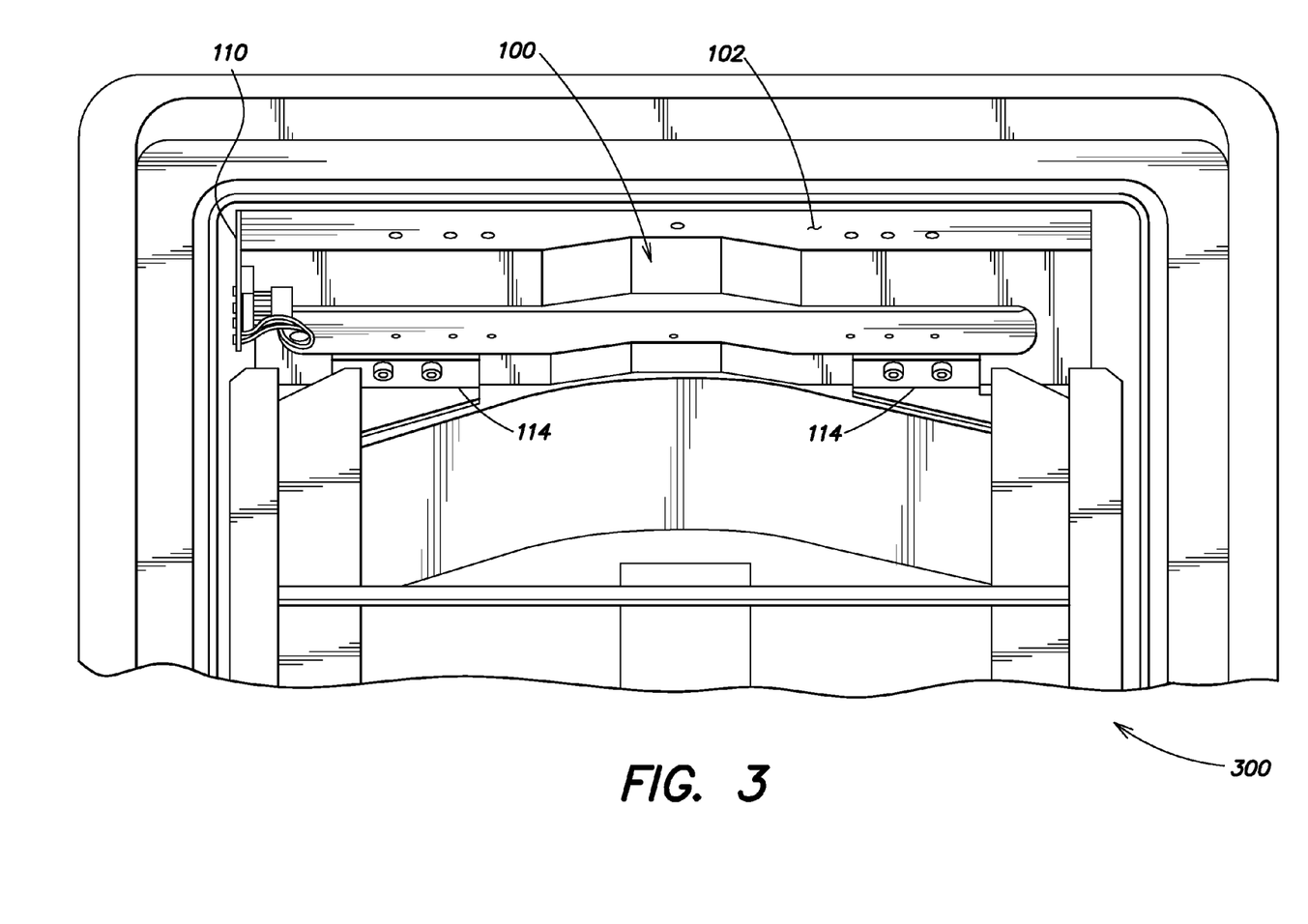
FIG. 3 is a front perspective view of an example embodiment of the apparatus of the invention as installed in a substrate transfer chamber.

FIG. 3 illustrates a front perspective view of an embodiment of the apparatus 100 of the present invention as installed in a substrate transfer chamber 300. The support frame 102 may be secured to a substrate transfer chamber with brackets 114. The brackets 114 may be constructed of any appropriate material to facilitate heat dissipation from the support frame 102 to the substrate transfer chamber wall. Such materials may be stainless steel, other thermally conductive metals, or the like. Other materials may be used. The brackets 114 may serve to transfer heat from the support frame 102 so as to reduce the temperature of the support frame 102 and further protect the optical componentry 108 and the controller 110 from heat exposure and damage. In some embodiments, the controller 110 may be coupled to brackets 114 or may be set apart from brackets 114. When coupled to a bracket 114, the controller 110 may be insulated therefrom by insulating materials (e.g., nylon spheres, plastic spacers, etc.).

Figure 4:
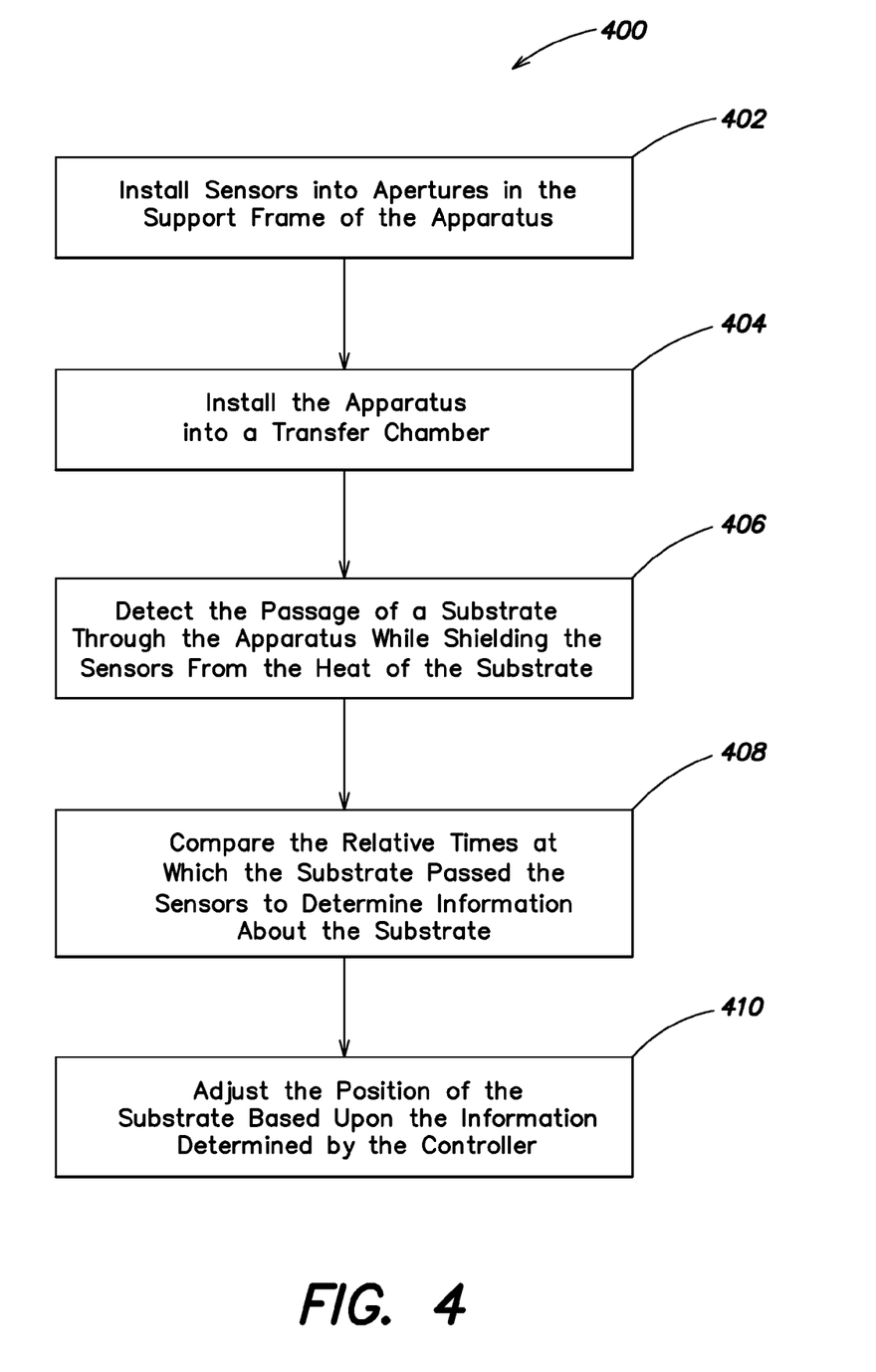
FIG. 4 is a flowchart depicting an example method of use of the example apparatus embodiment according to the present invention.

FIG. 4 depicts an exemplary method 400 of the present invention which includes the installation and use of the apparatus 100 in a transfer chamber. In Step 402, an array of sensors (e.g., optical devices 108, including optical sensors and/or emitters) may be installed into apertures in the support frame 102. Any practicable type of sensor adapted to detect a substrate may be employed. Connection wires, or connective wire pairs, for example, between the sensors and the controller 110 may be threaded and potted in the wiring channels 112. The sensors may be aligned so as to be able to detect a substrate passing through the cut away region 104 of the apparatus 100.

In Step 404, the apparatus 100 may be installed into a transfer chamber such that the cut away region 104 is aligned with a slit valve of the transfer chamber. Thermally conductive brackets 114 may be used to secure the apparatus 100 to the inside of the transfer chamber 300. Securing the apparatus to the inside of the transfer chamber 300 may be advantageous as compared to mounting the brackets to the chamber floor, which may require modifications thereto.

In Step 406, a hot substrate may be passed through the cut away region 104 while the sensors, shielded in the support frame 102, detect the substrate. The material of the support frame 102 may reflect the heat of the substrate (and/or heat from any other sources such as processing chambers) away from the sensors. In addition or alternatively, the support frame 102 and the brackets 114 may conduct the heat radiated by the substrate (and/or any other heat sources) away from the sensors into, for example, the walls of the transfer chamber.

In Step 408, the controller 110, for example, may compare the relative times at which sensors detect the passage of the substrate to determine information about the substrate (e.g., the size of the substrate, the relative position of the substrate, the center of the substrate, etc.) For example, if two sensors, symmetrically disposed on either end of the support frame 102, indicate that a substrate passed both sensors at the same time (e.g., leading edges and/or trailing edges of the substrate were detected by both of the sensors at the same times), the controller 110 may determine that the center of the substrate (e.g., relative to a width dimension of the substrate) lies on a line that is equidistant between the two sensors. Further, in some embodiments, the timing of the edge detection signals may indicate a center location or line in a dimension parallel to the motion of the substrate. In another example, if two sensors, symmetrically disposed on either end of the support frame 102, indicate that a substrate's edges passed the sensors at different times, the controller 110 may determine that, e.g., the substrate is shifted closer to one of the sensors by an amount that may be computed based on the known shape of the substrate (e.g., the known curvature of the edge of a round substrate of a certain diameter).

In Step 410, the position of the substrate may be adjusted based upon the information determined by the controller 110 (e.g., to center the substrate). For example, an end effector may be used to shift the substrate's position by an amount equal to, and opposite of, the amount of shift determined in Step 408.

Figure 5:
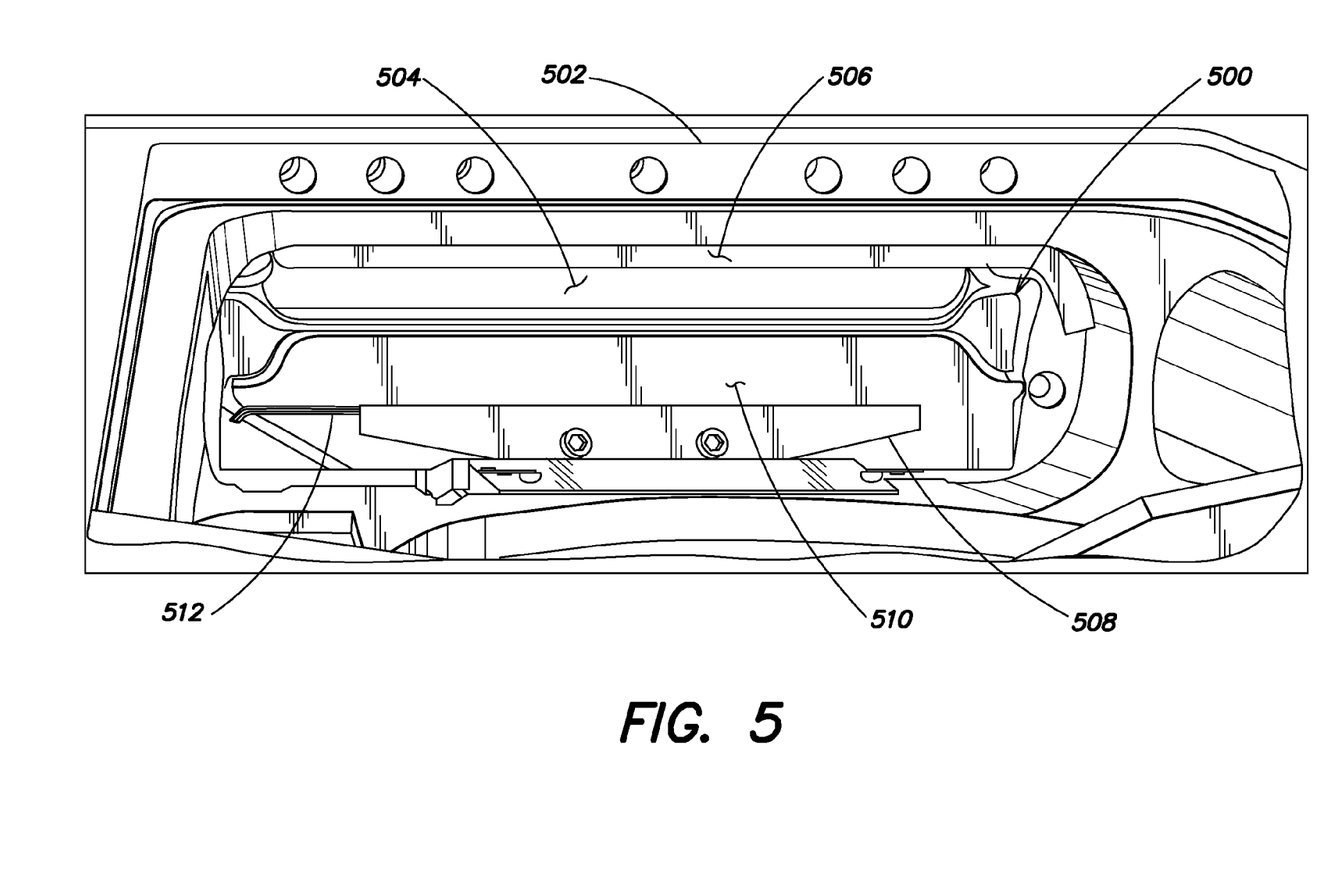
FIG. 5 is a front perspective view of an example embodiment of the present invention.

Turning to FIG. 5, a front perspective view of an example embodiment of the present invention is depicted. In the embodiment shown herein, an apparatus 500 is mounted to a slit valve assembly 502. The apparatus 500 may be positioned between the slit valve assembly 502 and the transfer chamber walls (not shown). The apparatus 500 may include the cut-away region 504, to allow a substrate to pass therethrough. A number of sensors (not shown), similar to those described above with respect to FIGS. 1-3, may be mounted in the frame of the apparatus 500, and positioned above the cut-away region 504, in an area indicated as 506. A moving emitter array 508 may be attached to a door 510 of the slit valve assembly 502.

A number of optical emitters (not shown), corresponding to the number of sensors, may be mounted in the moving emitter array 508. The sensors, as opposed to the emitters, may be preferably mounted above the cut-away region 504 because the sensors may be more susceptible to being blocked by particles or other contamination than the emitters. Other orientations may be used.

In this position, the sensors may also be shielded from radiant heat by the frame (described above) of the apparatus 500. The frame of the apparatus 500 may also contain optical channels or holes that may limit the field of view of the sensors, thereby enhancing accuracy and reducing the potential for damage to the sensors, regardless of the positioning of the emitters/sensors. In some embodiments, the sensors may be more sensitive to high temperatures and light than the emitters. In these embodiments, limiting the field of view of the sensors may provide the highest level of benefit for accuracy enhancement.

The optical emitters and sensors may be mounted onto the apparatus 500 in locations such that accurate measurements of passing substrates may be obtained, as described above. Additionally, standardized center-finder software algorithms may be used to determine the center of the substrate, based on the measurements obtained, as described above. For example, the edges of the substrate may be sensed to create mathematical representations of chords across the diameter of the substrate. Perpendiculars to the chords may then be checked to determine crossing points of the chords, and from the crossing points, the substrate's true center may be calculated. Thus, the substrate may be measured and the substrate center determined at the entrance to each processing chamber or cluster tool. In other embodiments, the center points of diametrically opposed sample points may be used to determine the center, as described above. In still other embodiments, a combination of both methods may be used to determine the center of the substrate.

As described above, the moving emitter array 508 may be attached to the door 510 of the slit valve assembly 502. Therefore, when the actuator (not shown) moves (e.g., opens or closes) the slit valve door 510, the moving emitter array 508 may move with the door 510. Alternatively, the emitter array 508 may be attached to a stationary actuator (not shown) adapted to control the slit valve assembly 502, thereby making the emitter array 508 stationary. The apparatus 500 may be positioned between the slit valve assembly 502 and the transfer chamber such that when the slit valve door 510 ("moving portion") is in a closed position, the slit valve door 510 may shield the optical emitters and sensors from process chemistry and other hazards. When the slit valve door 510 is in an open position, thereby allowing the substrate to pass through the cut-away region 504, the emitters may be aligned with the sensors to determine the center of the substrate.

The moving emitter array 508 embodiment may be advantageous because the moving emitter array 508 may be relatively easy to mount, and the axis of each optical emitter may be better aligned with the axis of each corresponding sensor, e.g., more or less parallel with the plane of the door 510. On the other hand, an advantage of the stationary emitter array 508 may be that the wiring may not move during operation of the door 510.

The optical emitters and sensors may include connective wiring 512, which may be covered or encapsulated such that the connective wiring 512 is locked into the pre-set position and protected from harm by mechanical, chemical or electrical hazards. Additionally, the apparatus 500 may include protective windows (not shown) to cover the optical emitters and sensors to further prevent process chemistry damage. The protective windows may be, for example, inert windows, lenses, light pipes, or other components made from materials compatible with process chemistry. For example, the protective windows may cover the optical emitters and sensors at all times. In this example, the protective windows may be made from a material that may still allow the substrate measurements to be taken.

To further prevent possible damage to the optical emitters and sensors, wire- or logic capability may be used to limit the amount of wiring that is required to connect multiple sensors to the robot or system control logic. Alternatively, each sensor set (sensor and emitter) may be individually connected if data I/O channels are available. Additionally, the circuitry may be designed to parallel ("wire- or logic") pre-existing center-finder sensor arrays. The operational selection between chamber slit valve locations may be made by controlling the light emitters on the various center-finders in the array.

The installation of the "add-in" embodiment described in FIG. 5 onto pre-existing substrate processing systems may occur during routine maintenance downtime with minimal impact to production. Additionally, robot or system controller software updates to accommodate the present invention may also occur at that time.

Figure 6:
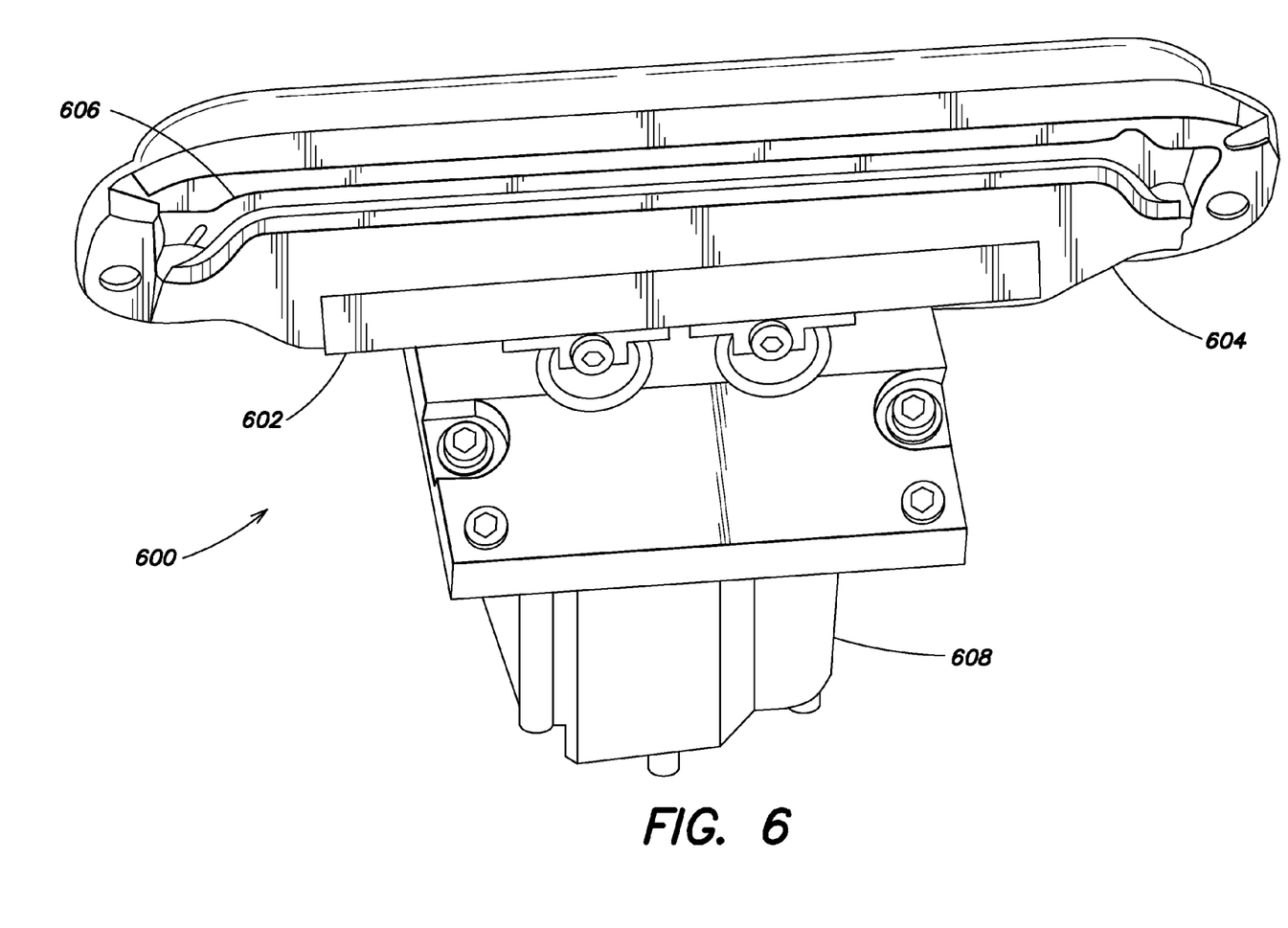
FIG. 6 is a front perspective view of an example embodiment of the present invention.

Turning to FIG. 6, a front perspective view of an example embodiment 600 of the present invention is depicted. In the embodiment shown herein, an optical emitter array 602 may be configured to be integral to an I/O slit valve door 604 and the opposing optical sensor devices (not shown) may be mounted integrally to the stationary portion of a slit valve frame 606 located above a cut-away region of the assembly (shown in FIG. 5). Alternatively, the optical emitter array 602 may be integrally formed in the lower body of a slit valve actuator 608, itself. When the slit valve door 604 is in an open position, allowing a substrate to pass therethrough, the optical components may be aligned, and therefore able to obtain substrate measurements, as described above. The embodiment described herein may also include the features described above with respect to FIG. 5.

The foregoing description discloses only exemplary embodiments of the invention. Modifications of the above disclosed apparatus and method which fall within the scope of the invention will be readily apparent to those of ordinary skill in the art. For instance, the apparatus and methods described herein may be used in other sensing applications such as edge finding and may also be used in other processing environments such as substrate loading and/or processing chambers. The invention may also be realized utilizing other materials or configurations designed to provide a center finder which does not impede the substrate and is resistant to reflective radiant heat.

Accordingly, while the present invention has been disclosed in connection with exemplary embodiments thereof, it should be understood that other embodiments may fall within the spirit and scope of the invention, as defined by the following claims.

The invention claimed is:

1. An apparatus for locating a center of a substrate, comprising:
    a frame, mountable between a slit valve assembly and a transfer chamber wall in substrate processing equipment, the frame including a cut away region;
    at least two emitters, housed in the frame, and each adapted to emit a signal;
    at least two sensors, housed in the frame, and each adapted to receive the emitted signal; and
    a controller adapted to determine a center of a substrate based on the signals received by the sensors;
    wherein the at least two emitters are vertically aligned with and opposing the at least two sensors across the cut away region of the frame, such that the emitted signal is provided across the cut away region of the frame.

2. The apparatus of claim 1, wherein the at least two sensors and the at least two emitters are adapted to indicate the presence of the substrate.

3. The apparatus of claim 2, wherein the frame is adapted to protect the at least two emitters and at least two sensors from thermal hazards.

4. The apparatus of claim 2, wherein the at least two sensors and the at least two emitters together each form a corresponding pair.

5. The apparatus of claim 4 wherein the two or more corresponding pairs are at least one of covered and encapsulated.

6. The apparatus of claim 5 wherein the at least one of covering and encapsulation is adapted to protect the two or more sensor and emitter pairs from at least one of thermal, mechanical, chemical, electrical or other hazards during substrate processing.

7. The apparatus of claim 4, further including at least two connective wire pairs adapted to connect the two or more sensor and emitter pairs to the controller.

8. The apparatus of claim 7, wherein the at least two connective wire pairs are at least one of covered and encapsulated.

9. The apparatus of claim 4, wherein the apparatus further includes a door adapted to selectively shield the two or more sensor and emitter pairs from mechanical, thermal, chemical, electrical or other hazards during substrate processing.

10. The apparatus of claim 9 wherein the door is adapted to shield the two or more sensor and emitter pairs when the door is in a closed position.

11. The apparatus of claim 1, wherein the controller is adapted to use algorithms to determine the location of the center of the substrate.

12. The apparatus of claim 1 wherein the emitted signal is an optical signal.

13. An apparatus for locating a center of a substrate, comprising:
    an I/O slit valve assembly, including a slit valve door adapted to selectively open and close the I/O slit valve, wherein the I/O slit valve assembly is positioned within a valve seat frame of a semiconductor processing equipment, the frame including a cut away region;
    at least two emitters, mounted integrally to the slit valve door, and each adapted to emit a signal across the cut away region;
    at least two sensors, mounted integrally to the slit valve frame, and each adapted to receive the emitted signal, wherein the at least two emitters and the at least two sensors are opposing optical devices across the cut away region of the slit valve frame; and
    a controller adapted to determine a center of a substrate based on the signals received by the sensors.

14. The apparatus of claim 13 wherein the slit valve door and the slit valve frame are adapted to selectively align the at least two emitters and sensors; and wherein the at least two sensors and the at least two emitter together each form a pair.

15. The apparatus of claim 14, further including at least two connective wire pairs adapted to connect at least two emitter and sensor pairs to the controller.

16. The apparatus of claim 14, wherein the at least two connective wire pairs are at least one of covered and encapsulated.

17. The apparatus of claim 14, wherein the at least two emitter and sensor pairs are aligned when the slit valve door is opened.

18. The apparatus of claim 14, wherein the at least two sensor and emitter pairs are at least one of covered and encapsulated to protect the at least two sensor and emitter pairs from thermal, mechanical, chemical, electrical or other hazards during substrate processing.

19. The apparatus of claim 13 wherein the emitted signal is an optical signal.

20. A system comprising:
    a transfer chamber including a slit valve;
    a frame, mountable between the slit valve assembly and a transfer chamber wall in substrate processing equipment, the frame including a cut away region;
    at least two emitters, housed in the frame, and each adapted to emit a signal;
    at least two sensors, housed in the frame, and each adapted to receive the emitted signal; and
    a controller adapted to determine a center of a substrate based on the signal received by the sensors; wherein the at least two emitters are vertically aligned with and opposing the at least two sensors across the cut away region of the frame, such that the emitted signal is provided across the cut away region of the frame.

21. The system of claim 20, wherein the at least two sensors and the at least two emitters together each form a pair; and wherein the at least two sensor and emitter pairs are at least one of covered and encapsulated to protect the at least two sensor and emitter pairs from thermal, mechanical, chemical, electrical or other hazards during substrate processing.

22. The system of claim 20, further including at least two connective wire pairs adapted to connect the at least two emitters and the at least two sensors to the controller.

23. The apparatus of claim 22, wherein the at least two connective wire pairs are at least one of covered or encapsulated.

* * * * *